United States Patent
Bernstein et al.

(10) Patent No.: US 7,882,334 B2
(45) Date of Patent: *Feb. 1, 2011

(54) PROCESSOR PIPELINE ARCHITECTURE LOGIC STATE RETENTION SYSTEMS AND METHODS

(75) Inventors: Kerry Bernstein, Underhill, VT (US); Kenneth J. Goodnow, Essex, VT (US); Clarence R. Ogilvie, Huntington, VT (US); Christopher B. Reynolds, Underhill, VT (US); Sebastian T. Ventrone, South Burlington, VT (US); Keith R. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1223 days.

This patent is subject to a terminal disclaimer.

(21) Appl. No.: 11/276,236

(22) Filed: Feb. 20, 2006

(65) Prior Publication Data
US 2007/0198808 A1    Aug. 23, 2007

(51) Int. Cl.
*G06F 15/76* (2006.01)
*G06F 1/00* (2006.01)
(52) U.S. Cl. .......................... 712/40; 713/330
(58) Field of Classification Search ............. 712/40, 712/330
See application file for complete search history.

(56) References Cited

U.S. PATENT DOCUMENTS

| | | | |
|---|---|---|---|
| 4,743,864 A * | 5/1988 | Nakagawa et al. | 331/1 A |
| 4,843,300 A * | 6/1989 | Alderman | 323/224 |
| 5,652,729 A | 7/1997 | Iwata et al. | |
| 5,777,347 A | 7/1998 | Bartelink | |
| 6,075,739 A | 6/2000 | Ihara | |
| 6,266,722 B1 | 7/2001 | Ogura | |
| 6,548,848 B2 | 4/2003 | Horiguchi et al. | |
| 6,720,619 B1 | 4/2004 | Chen et al. | |
| 7,103,522 B1 | 9/2006 | Shepard | |
| 7,352,611 B2 | 4/2008 | Isoda et al. | |
| 7,397,718 B2 | 7/2008 | Bernstein et al. | |
| 2002/0038888 A1 | 4/2002 | Kadowaki et al. | |

(Continued)

OTHER PUBLICATIONS

Yang, Han, U.S. Appl. No. 12/180,776, Office Action, Mar. 22, 2010, 16 pages.

(Continued)

*Primary Examiner*—Daniel Pan
(74) *Attorney, Agent, or Firm*—David A. Cain; Hoffman Warnick LLC

(57) ABSTRACT

A system, method and program product for retaining a logic state of a processor pipeline architecture are disclosed. A comparator is positioned between two stages of the processor pipeline architecture. A storage capacitor is coupled between a storage node of the comparator and a ground to store an output of the early one of the two stages. A reference logic is provided, which has the same value as the output of the early stage. A logic storing and dividing device is coupled between the reference logic and a reference node of the comparator to generate a logic at the reference node, which is a fraction of the reference logic, and to retain a logic state of the information stored on the storage capacitor. Further mechanisms are provided to determine validity of data stored in the logic storing and dividing device.

17 Claims, 8 Drawing Sheets

U.S. PATENT DOCUMENTS

| | | | |
|---|---|---|---|
| 2002/0186572 A1* | 12/2002 | Nishida et al. | 363/21.16 |
| 2003/0078763 A1 | 4/2003 | Chuang et al. | |
| 2005/0040881 A1 | 2/2005 | Brown et al. | |
| 2005/0218942 A1* | 10/2005 | Yamashita | 327/108 |
| 2007/0198808 A1 | 8/2007 | Bernstein et al. | |
| 2007/0242507 A1 | 10/2007 | Bernstein et al. | |
| 2009/0109781 A1 | 4/2009 | Bernstein et al. | |
| 2009/0287905 A1* | 11/2009 | Bernstein et al. | 712/1 |

OTHER PUBLICATIONS

Yang, Han, U.S. Appl. No. 11/924,955, Notice of Allowance, May 5, 2010, 10 pages.

Yang, Han, U.S. Appl. No. 11/279,507, Office Action, Dec. 14, 2007, 30 pages.

Yang, Han, U.S. Appl. No. 11/279,507, Notice of Allowance, Jun. 30, 2008, 17 pages.

Yang, Han, U.S. Appl. No. 12/180,776, Notice of Allowance, Aug. 4, 2009, 9 pages.

Yang, Han, U.S. Appl. No. 12/180,776, Amendment to Office Action, 7 pages.

Yang, Han, U.S. Appl. No. 12/180,776, Office Action, Mar. 19, 2009, 9 pages.

Luu, Pho M., U.S. Appl. No. 12/045,744, Office Action, Jun. 9, 2010, 13 pages.

Luu, Pho M., U.S. Appl. No. 11/279,639, Notice of Allowance, Dec. 17, 2007, 12 pages.

Doan, Nghia M., U.S. Appl. No. 11/924,935, Office Action, Feb. 18, 2010, 10 pages.

Doan, Nghia M., U.S. Appl. No. 11/924,935, Notice of Allowance, Jun. 18, 2010, 8 pages.

* cited by examiner

PROCESSOR PIPELINE ARCHITECTURE LOGIC STATE RETENTION SYSTEMS AND METHODS

BACKGROUND OF THE INVENTION

1. Technical Field

The invention relates generally to a processor pipeline architecture with an intermittent power supply, and more particularly, to a method and system for retaining a logic state of such a processor pipeline.

2. Background Art

Pipelining is a standard feature in, e.g., a reduced instruction set computer (RISC) processor. In pipelining, a processor works on different steps of an instruction at the same time, so that more instructions can be executed in a shorter period of time. A practical problem with a pipeline type processor is data dependencies among different stages, which occurs when an instruction depends on the results of a previous stage.

Removal of power during the propagation of data from a stage to the next stage may make the data dependency problem even worse and cause a stall of the processor processing. Removal of power may be caused by an intermittent power supply, which is used when a regular stable power supply is not practical. In this situation, the processor needs to know the last valid logic state of the pipeline architecture to resume processing of an instruction after power is resumed. As such, the processor pipeline architecture needs to retain/remember the last logic state before power is removed. Current state of art technology does not provide a successful solution to this problem.

Based on the above, there is a need in the art for a solution to retain a logic state of a processor pipeline architecture.

SUMMARY OF THE INVENTION

A system, method and program product for retaining a logic state of a processor pipeline architecture are disclosed. A comparator is positioned between two stages of the processor pipeline architecture. A storage capacitor is coupled between a storage node of the comparator and a ground to store an output of the early one of the two stages. A reference logic is provided, which has the same value as the output of the early stage. A logic storing and dividing device is coupled between the reference logic and a reference node of the comparator to generate a logic at the reference node, which is a fraction of the reference logic, and to retain a logic state of the information stored on the storage capacitor. Further mechanisms are provided to determine validity of data stored in the logic storing and dividing device.

A first aspect of the invention provides a system between a first stage and a second stage of a multi-stage processor pipeline architecture for retaining a logic state of the multi-stage processor pipeline architecture, the system comprising: a comparing device including a storage node and a reference node, the storage node being coupled to an output of the first stage and the reference node being coupled to a reference logic that is the same as the output of the first stage; a storage capacitor being couple between the storage node and a ground; and a logic state storing and dividing device including a reference capacitor, the logic state storing and dividing device coupled between the reference node and the reference logic in a manner to generate a logic at the reference node that is a fraction of the reference logic.

A second aspect of the invention provides a method for retaining a logic state of a multi-stage processor pipeline architecture, the method comprising: coupling between a first stage and a second stage of the multi-stage processor pipeline architecture a storage cell, the storage cell including a comparing device that includes a storage node and a reference node; coupling the storage node to an output of the first stage; coupling the reference node to a reference logic that is the same as the output of the first stage; coupling a storage capacitor between the storage node and a ground to store the output of the first stage; and coupling a logic state storing and dividing device between the reference node and the reference logic in a manner to generate a logic at the reference node that is a fraction of the reference logic, the logic state and dividing device including a reference capacitor to retain a logic state of the multi-stage processor pipeline architecture.

A third aspect of the invention provides a program product stored on a computer-readable medium, which when executed, enables a computer infrastructure to retain a logic state of a multi-stage processor pipeline architecture, the program product comprising computer program code for enabling the computer infrastructure to: collect data regarding a state of a storage cell positioned between a first stage and a second stage of the multi-stage processor pipeline architecture, the storage cell including a comparing device which includes a storage node and a reference node, a storage capacitor being coupled between the storage node and a ground; control monitoring a power supply of the multi-stage processor pipeline architecture; control monitoring a clock phase of the multi-stage processor pipeline architecture; control connecting the storage node to an output of the first stage to store the output information in the storage capacitor; and control connecting the reference node to a reference logic that is the same as the output of the first stage; wherein a logic state storing and dividing device is coupled between the reference node and the reference logic in a manner to generate a logic at the reference node that is a fraction of the reference logic, the logic state and dividing device including a reference capacitor to retain a logic state of the multi-stage processor pipeline architecture.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

Figure 1A:
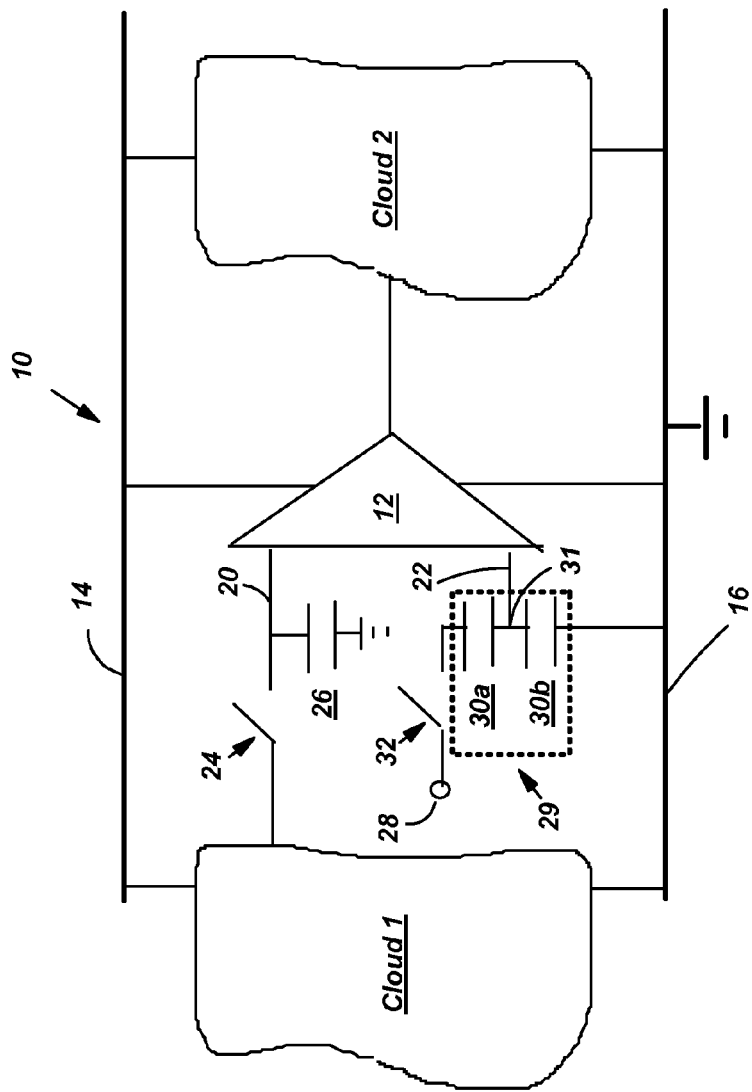
FIG. 1A shows a block diagram of one embodiment of a basic single-bit storage cell according to the invention.

Turning to the drawings, FIG. 1A shows a block diagram of one embodiment of a basic single-bit storage cell 10 according to the invention. Storage cell 10 is positioned between two stages of a processor pipeline architecture, e.g., stage 1 and stage 2. The function in a stage is referred to as a logic cloud in this description, for descriptive purpose only. The logic cloud in stage 1 is referred to as logic cloud 1 and the logic cloud in stage 2 is referred to as logic cloud 2.

As shown in FIG. 1A, storage cell 10 includes a comparator 12, which is coupled between an intermittent power rail 14 and a ground 16. Comparator 12 includes two input nodes, which are referred to as a storage node 20 and a reference node 22, respectively. Storage node 20 is coupled to an output of logic cloud 1 through a switch 24. A storage node capacitor 26 is coupled between storage node 20 and ground 16. In operation, when sufficient power is present to guarantee stable logic outputs from logic cloud 1, switch 24 is closed to transmit the output information of logic cloud 1 onto storage capacitor 26, i.e., charging storage capacitor 26. When storage capacitor 26 is fully charged, switch 24 may be opened, storing the output information on storage capacitor 26.

Storage cell 10 also includes a reference logic 28. According to one embodiment, a logic storing and dividing device 29 is coupled between reference logic 28 and reference node 22. For example, device 29 may include two reference capacitors 30a and 30b coupled in a series manner between reference logic 28 and ground 16. A switch 32 is coupled between reference logic 28 and reference capacitor 30a. An output 31 of device 29 is positioned between capacitors 30a and 30b. Reference node 22 of comparator 20 is coupled to output 31, as shown in FIG. 1A. In operation, at the same time as storage capacitor 26 is being charged, a reference logic "1" is enabled to reference capacitors 30a, 30b to charge the same. In this description, a logic level (value) of a data is determined based on the similarity of this data to the output of logic cloud 1. For example, logic "1" represents that a data has the same value as the output of logic cloud 1. As is understood, when reference capacitors 30a, 30b are fully charged, reference node 22 has a logic value that is a fraction of reference logic 28. For example, according to one embodiment, reference capacitors 30a and 30b are of substantially the same size. In this case, reference node 22 has a logic value half of that of reference logic 28, i.e., logic "½". According to one embodiment, reference capacitors 30a, 30b are of substantially the same size as storage capacitor 26, so that the charging times and decay times of the three capacitors are substantially the same. Accordingly to one embodiment, reference logic 28 always has a logic value of "1".

In operation, reference capacitors 30a, 30b store information transmitted from reference logic 28 to retain a logic state of the storage node (also a logic state of the processor pipeline) at reference node 22, reference node 22 logic being a fraction, here ½, of the storage node 20 logic when fully charged. In addition, a comparison of storage node 20 logic and reference node 22 logic may be used to monitor a clock phase of the processor pipeline architecture. For example, if storage node 20 logic is substantially twice of reference node 22 logic, it indicates that storage capacitor 26 is fully charged with the information transmitted from logic cloud 1; if storage node 20 logic is less than substantially twice of reference node 22 logic, it indicates that storage capacitor 26 has decayed to, e.g., transmit information to, e.g., logic cloud 2. Details regarding the applications of storage cell 10 will be described below.

Figure 1B:
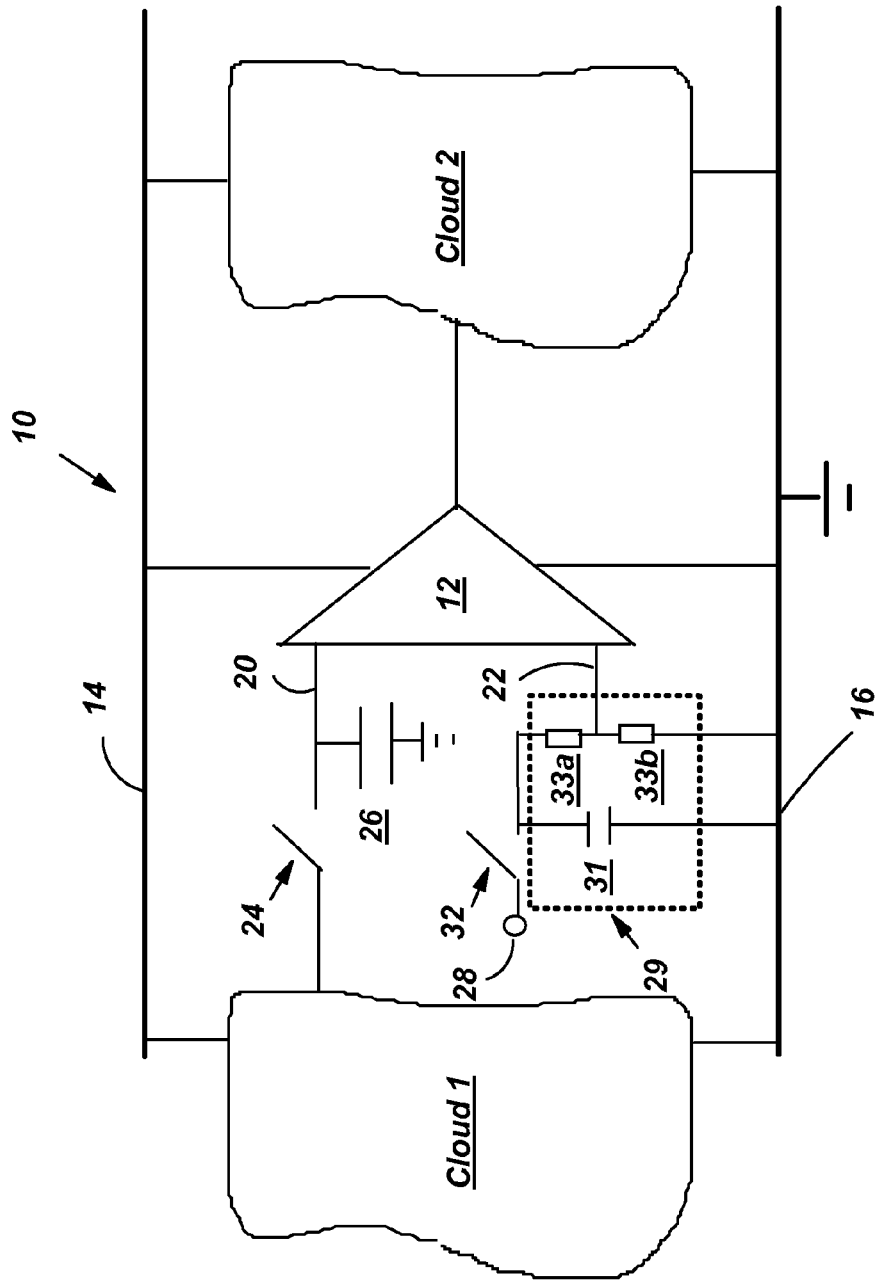
FIG. 1B shows a storage cell with an alternative embodiment of a logic storing and dividing device.

In the above described embodiment, two reference capacitors 30a, 30b of substantially the same size are used to produce a logic of "½" at reference node 22. It is understood that other combinations of reference capacitors 30a, 30b may produce different logic levels at reference node 22, i.e., different fractions of reference logic 28, which are also included in the scope of the current invention. In addition, other embodiments to achieve a reference node 22 logic being a fraction of reference logic 28 and to store the same are also included in the scope of the current invention. For example, FIG. 1B shows a storage cell 10 with an alternative embodiment of a logic storing and dividing device. In FIG. 1B, a combination of a reference capacitor 31, preferably of substantially the same size as storage capacitor 26, and two resistors 33a, 33b of substantially the same size in series may produce a logic "½" at reference node 22 and store the same.

Figure 2:
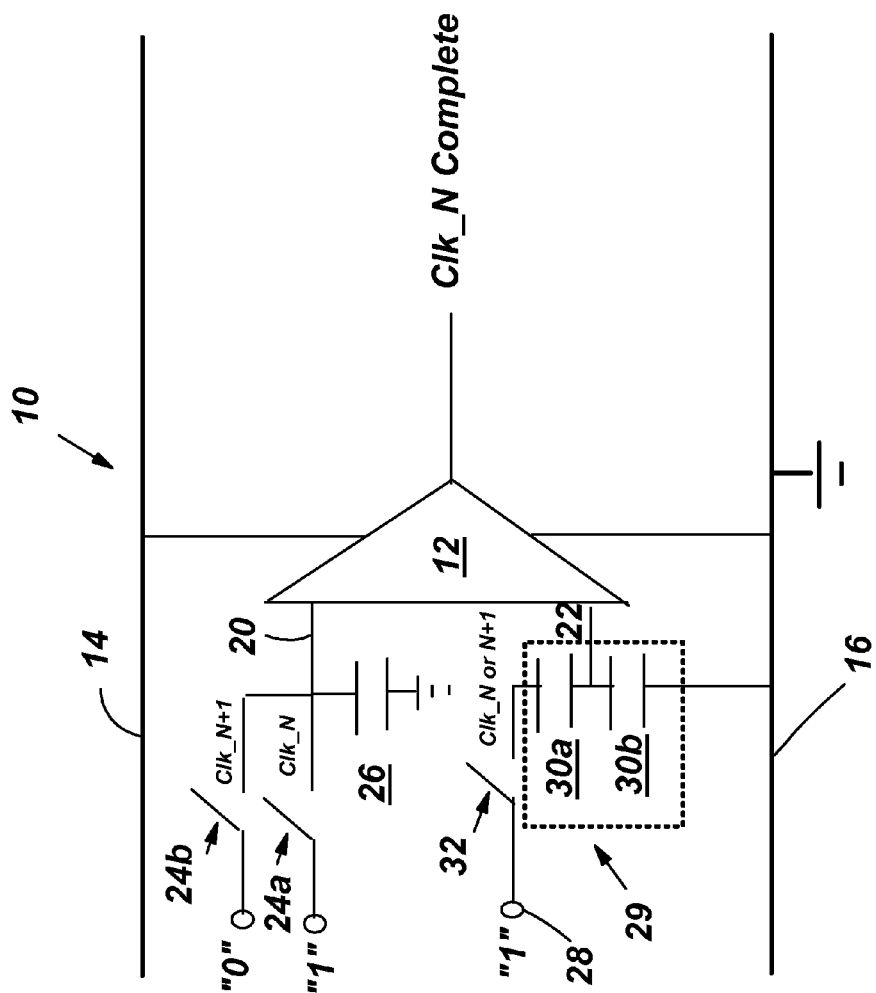
FIG. 2 shows a block diagram of one embodiment of a hardware implementation to retain a state of a last clock phase and/or to detect whether new data of a current clock phase is valid.

FIG. 2 shows a block diagram of one embodiment of a hardware implementation to retain a state of a last clock phase and/or to detect whether new data of a current clock phase is valid, which is developed based on storage cell 10 shown in FIG. 1A. Compared to FIG. 1A, storage node 20 and storage capacitor 26 in FIG. 2 are coupled to two different logics "1" and "0", through two switches 24a and 24b, during two clock phases Clk_N and Clk_N+1, respectively. Clk_N+1 is subsequent to Clk_N. Reference logic 28 has a logic value "1" during both Clk_N and Clk_N+1. In operation, during Clk_N, switch 24a and switch 32 are closed (switch on), which enables the charging of storage capacitor 26 and reference capacitors 30a, 30b to logic values "1" and "½", respectively. During Clk_N+1, logic "0" is enabled through switch 24b to storage capacitor 26, which causes storage capacitor to decay (or to be further charged) to logic "0". At the same time, during Clk_N+1, a same logic "1" is enabled to reference capacitors 30a, 30b through switch 32, which causes reference capacitors 30a, 30b and reference node 22 logic to maintain the same logic value "½" as in Clk_N. As a consequence, in the case that the state of Clk_N+1, i.e., logic "0", is lost due to, e.g., removal of power of intermittent power rail 14, the state of the last phase clock, Clk_N, may be retained at reference node 22.

According to another embodiment, the hardware implementation of FIG. 2 may also be used to detect whether new data is valid. For example, during clock phase Clk_N, if storage node 20 is detected by comparator 12 to have a logic value substantially twice of the logic value at reference node 22, data of Clk_N is considered to have been validly stored at storage node 20.

The embodiments described above work under the condition that there is a known energy in a power pulse supplied by intermittent power rail 14, which is sufficient to transmit and store a logic in the capacitors. Another condition is that the period between power pulses is less than the time-constant of the capacitors, i.e., leakage, so that a logic saved in the capacitors is valid. If the above two conditions are not guaranteed, a logic stored at reference node 22 needs to be monitored to guarantee the operations of the embodiments.

Figure 3:
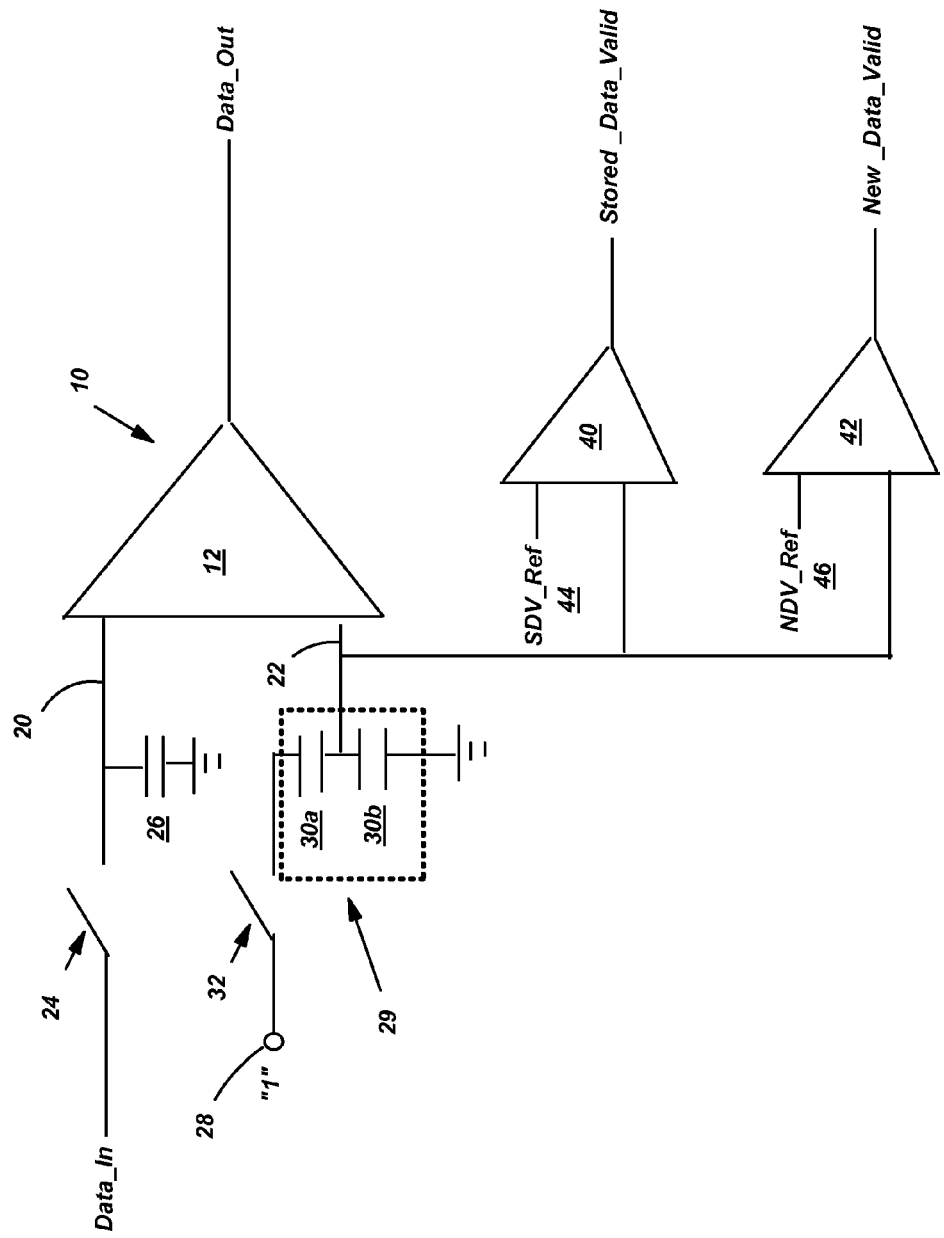
FIG. 3 shows an embodiment to monitor whether new data is valid and whether a retained (stored) logic state is valid.

FIG. 3 shows an embodiment to monitor whether new data is valid and whether a retained (stored) logic state is valid based on storage cell 10 of FIG. 1A. In addition to storage cell 10 of FIG. 1A, the embodiment of FIG. 3 includes two comparators 40 and 42. Comparator 40 includes two input nodes that are coupled to reference node 22 of comparator 12 and a "saved data valid reference" signal (SDV_Ref) 44, respectively. In operation, the logic at reference node 22 is compared to SDV_Ref 44 that represents a minimum voltage for the logic at reference node 22 to guarantee that data stored in reference capacitors 30a, 30b is valid to guarantee the operation of, e.g., storage cell 10. If the logic at reference node 22 is equal to or higher than SDV_Ref 44, comparator 40 outputs a "stored_Data_Valid" signal to indicate that data retained at reference node 22 is valid. If "stored_Data_Valid" signal is inactive, some other means must be used to restart the processor pipeline architecture to resolve the problem.

Comparator 42 includes two input nodes that are coupled to reference node 22 of comparator 12 and a "new data valid reference" signal (NDV_Ref) 46, respectively. In operation, the logic at reference node 22 is compared to NDV_Ref 46 that represents a minimum voltage for the logic at reference node 22 to guarantee that reference capacitors 30a, 30b (and thus storage capacitor 26) has been fully charged to store/retain the new data transferred from logic cloud 1 (FIG. 1A), reference node 22 logic being ½ of the storage node 20 logic. If the logic at reference node 22 is equal to or higher than NDV_Ref 45, comparator 42 outputs a "New_Data_Valid" signal to indicate that new data has already been successfully latched into storage cell 10. This "New_Data_Valid" signal may be fed forward to the next pipeline stage, e.g., logic cloud 2 (FIG. 1A), to indicate that a function on logic cloud 2 may proceed. The "New_Data_Valid" signal may also be fed back to the previous (early) pipeline stage, e.g., logic cloud 1, to indicate that data has been accepted. According to an alternative embodiment, the "New_Data_Valid" signal may be communicated to a pipeline controller (not shown) to indicate a successful pipeline transfer, thus the current clock phase may be turned off and a next clock phase may be started.

Figure 4:
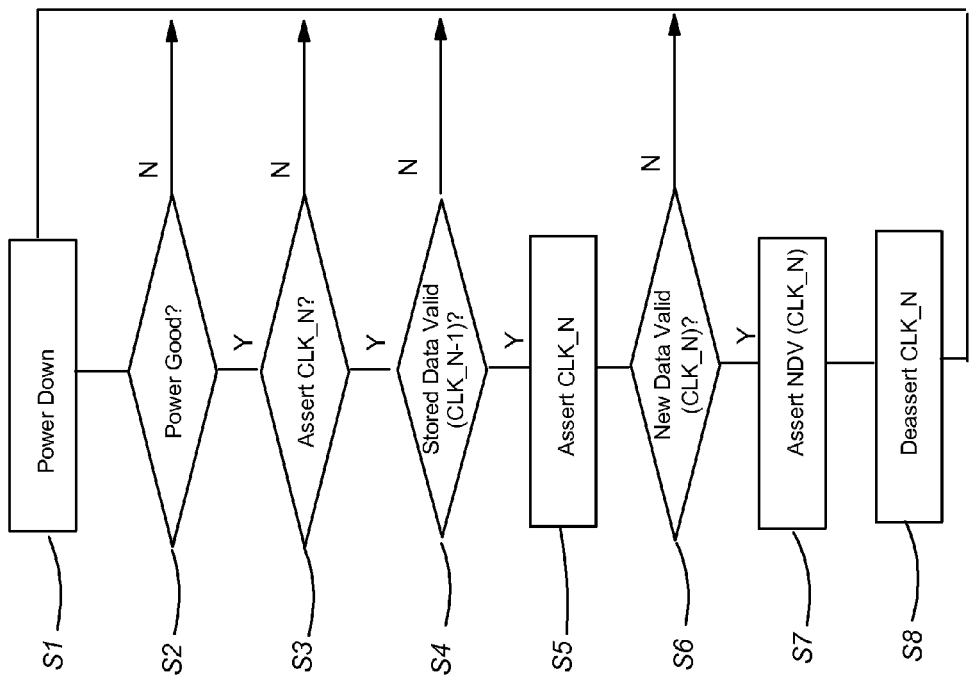
FIG. 4 shows a flow diagram of one embodiment of an operation of the hardware embodiment of FIG. 3.

FIG. 4 shows a flow diagram of one embodiment of an operation of the hardware embodiment of FIG. 3. First, in step S1, during a power down state, the processor pipeline architecture including storage cell 10 waits for power to be restored. Next, in step S2, a power supply may be monitored during any time of the operation of storage cell 10. If the power is down, the operation of the processor pipeline architecture including storage cell 10 (hereinafter, "the operation") goes back to the power down state of step S1; if the power is on, the operation continues to the next step S3.

Next in step S3, whether the current clock phase (CLK_N) is to be asserted is checked. If the check yields a positive result ("Y"), the operation continues to the next step S4; if the check yields a negative result ("N"), the operation pauses to wait for a clocking and return to step S1.

Next in step S4, whether the data stored at reference node 22 is valid for the last clock phase, e.g., CLK_N−1, is monitored. The monitoring process has been described above with respect to FIG. 3. For example, the "Stored_Data_Valid" signal (FIG. 3) indicates a positive result; and an inactive "Stored_Data_Valid" signal indicates a negative result. If a negative result is obtained, the operation pauses to wait for a next clock phase to recover the state (data) of the last clock phase. If a positive result is obtained, the operation proceeds to the next step S5.

Next, in step S5, current clock phase (CLK_N) is asserted. Storage capacitor 26 is charged to store a new logic, and references capacitors 30a, 30b (FIG. 1A) are charged to generate and store a logic at reference node 22, according to, for example, the operation of storage cell 10 as described above with respect to FIG. 1A.

Next, in step S6, whether the new data "latched" during the current clock phase (n) is valid is monitored, according to, e.g., the operation procedure described above with respect to FIG. 3. For example, the "New_Data_Valid" signal (FIG. 3) indicates a positive result; and an inactive "New_Data_Valid" signal indicates a negative result. If a negative result is obtained, i.e., "N" at stop S6, the operation pauses to wait for a next clock phase to refresh the operation. If a positive result is obtained, i.e., "Y" at step S6, the operation proceeds to the next step S7.

In step S7, the "New_Data_Valid" signal is asserted to, e.g., a next logic cloud (here, e.g., logic cloud 2), a previous logic cloud (here, e.g., logic cloud 1), or a pipeline controller, to indicate that the new data is successfully stored in storage capacitor 26.

Next in step S8, the current clock phase (CLK_N) is de-asserted to lock data into storage cell 10.

It is understood that at any point in the operation process described above, power supply may be removed and data of the current clock phase may be lost. According to the current invention, the data may be recovered during the next power cycle.

Figure 5:
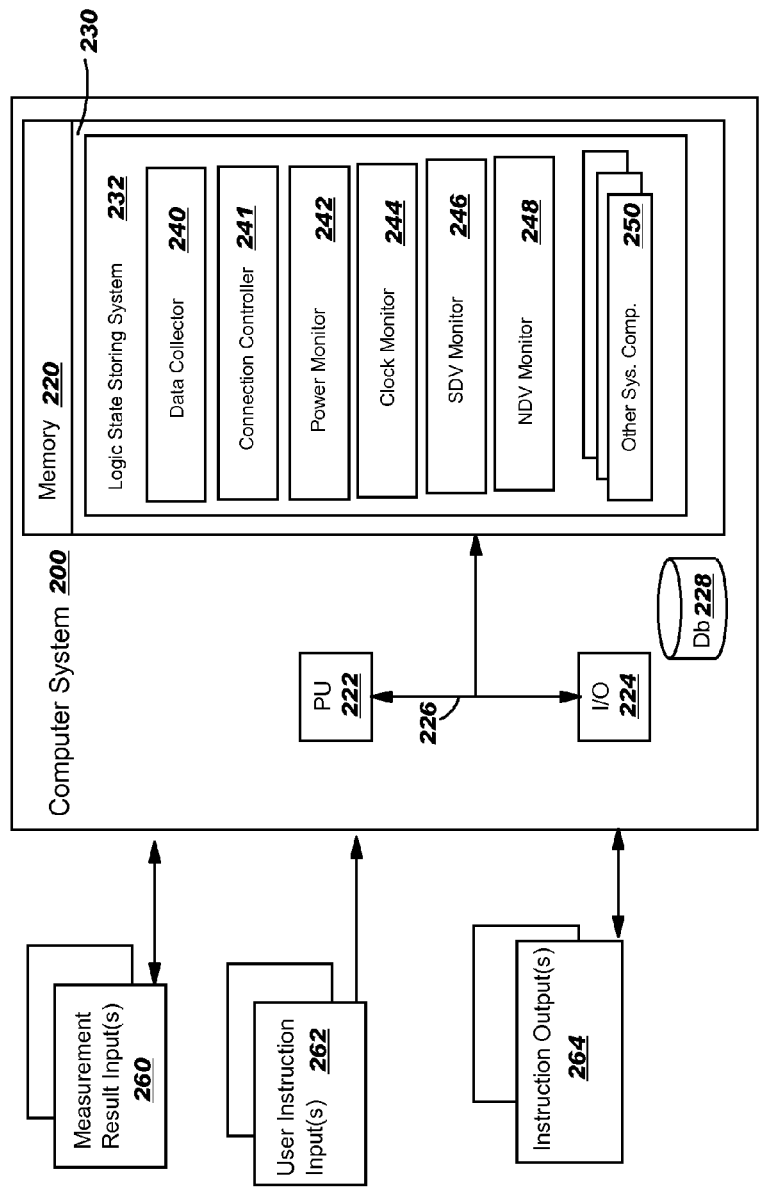
FIG. 5 shows a block diagram of an illustrative computer system.

According to one embodiment, a computer system 200 may be used to control the implementation of the method as shown in FIG. 4. FIG. 5 shows a block diagram of an illustrative computer system 200 according to the present invention. In one embodiment, computer system 200 includes a memory 220, a processing unit (PU) 222, input/output devices (I/O) 224 and a bus 226. A database 228 may also be provided for storage of data relative to processing tasks. Memory 220 includes a program product 230 that, when executed by PU 222, comprises various functional capabilities described in further detail below. Memory 220 (and database 228) may comprise any known type of data storage system and/or transmission media, including magnetic media, optical media, random access memory (RAM), read only memory (ROM), a data object, etc. Moreover, memory 220 (and database 228) may reside at a single physical location comprising one or more types of data storage, or be distributed across a plurality of physical systems. PU 222 may likewise comprise a single processing unit, or a plurality of processing units distributed across one or more locations. I/O 224 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 200.

As shown in FIG. 5, program product 230 may include a logic state storing system 232 that includes a data collector 240; a connection controller 241; a power monitor 242; a clock monitor 244; a stored data validity (SDV) monitor 246; a new data validity (NDV) monitor 248; and other system components 250. Other system components 250 may include any now known or later developed parts of a computer system 200 not individually delineated herein, but understood by those skilled in the art.

Inputs to computer system 200 include measurement result inputs 260 and user instruction inputs 262. Measurement result inputs 260 include any information regarding the operation or status of storage cell 10 (e.g., FIG. 3) and all components coupled thereto. User instruction inputs 262 include instruction of a user of computer system 200 regarding the operation of, inter alia, storage cell 10 and all components coupled thereto, for example, SDV_Ref 44 value and NDV_Ref 46 value (FIG. 3) used in determining the stored_data_valid and the new_data_valid, respectively. Those inputs may be communicated to computer system 200 through I/O 224 and may be stored in database 228 and may be obtained by data collector 240. Outputs of computer system 200 include instruction outputs 264 that are communicated to, inter alia, an automatic control implementation components, for example, a pipeline controller, to automatically adjust, e.g., clocking of the processor pipeline architecture.

With reference to FIG. 4 also, in operation, connection controller 241 may control the switches of storage cell 10 (or those coupled to storage cell 10) during different clock phases to connect or disconnect the various channels (loops) of storage cell 10, as described above. Power monitor 242 may control the implementation of step S1 and S2. Clock monitor 244 may control the implementation of step S3. SDV monitor 246 may control the implementation of steps S4 and S5. NDV Monitor 248 may control the implementation of steps S6, S7 and S8.

Figure 6:
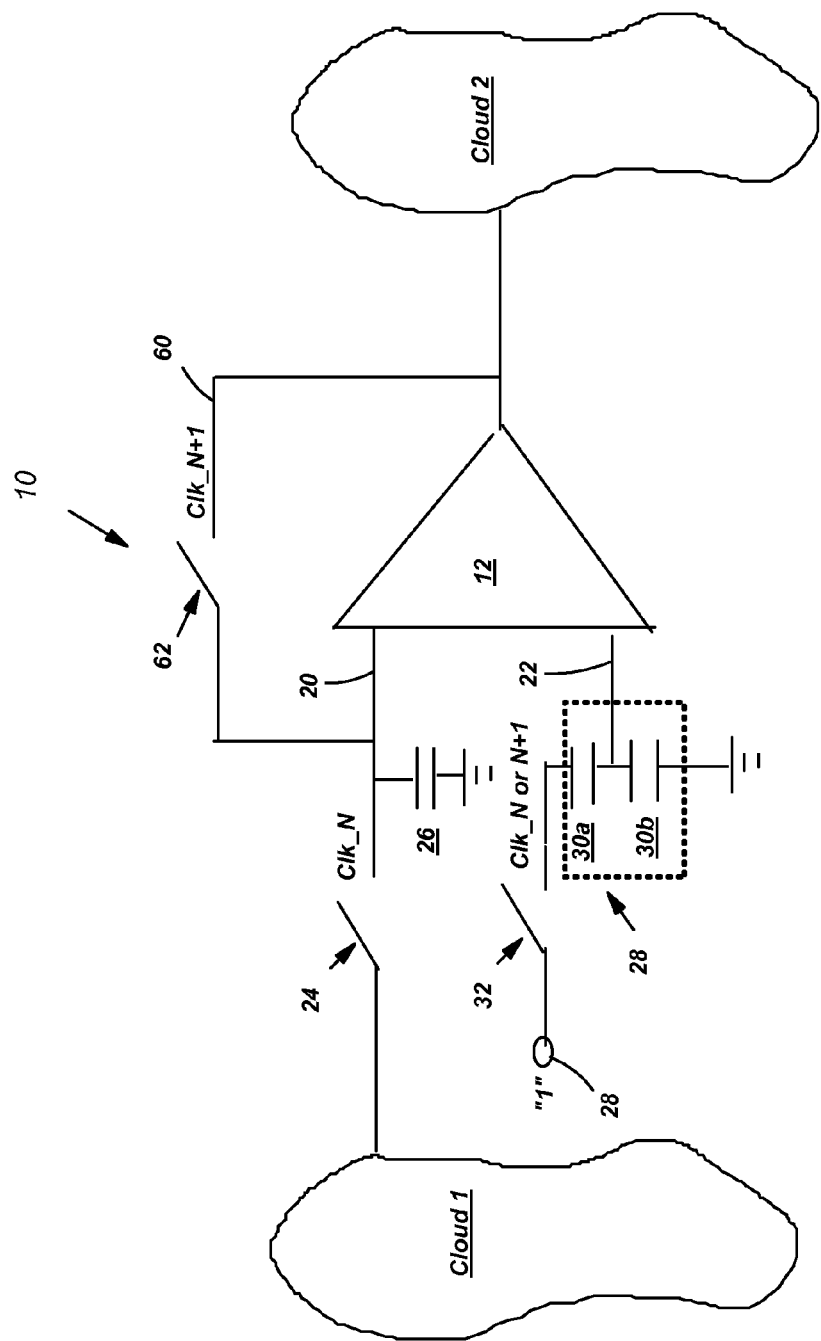
FIG. 6 shows an alternative embodiment to restore a logic state of a last clock phase.

FIG. 6 shows an alternative embodiment to restore a logic state of the last clock phase. As shown in FIG. 6, a feedback loop 60 feedbacks an output of comparator 12 back to storage node 20, through a switch 62. In operation, during current clock phase Clk_N, switch 24 is turned on, which causes charging of storage capacitor 26. During the next clock phase, e.g., Clk_N+1, information stored in storage capacitor 26 is transmitted to the next logic cloud, e.g., logic cloud 2. At the same time, during CLK_N+1, switch 62 in feedback loop 60 is turned on to transmit the information back to storage node 20, which is again stored onto storage capacitor 26.

Figure 7:
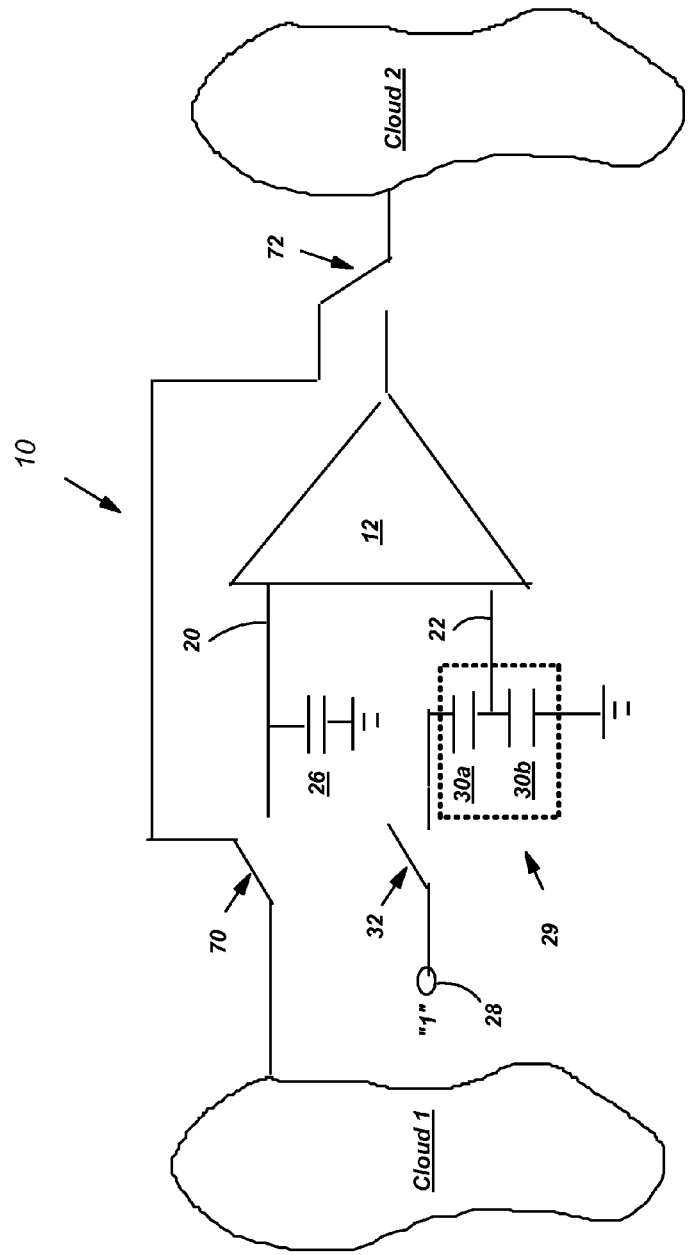
FIG. 7 shows an alternative embodiment of a storage cell with a bypass.

FIG. 7 shows an alternative embodiment of a storage cell with a bypass. As shown in FIG. 7, switches 70 and 72 may be switched to bypass storage cell 10 and transmit information from logic cloud 1 directly to logic cloud 2. The bypass makes the processor pipeline architecture operate more efficiently when it is known that power will continue to be valid.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A system between a first stage and a second stage of a multi-stage processor pipeline architecture for retaining a logic state of the multi-stage processor pipeline architecture, the system comprising:
    a comparing device including a storage node and a reference node, the storage node being coupled to an output of the first stage and the reference node being coupled to a reference logic value that is the same as the output of the first stage and wherein the storage node is further coupled to a second different logic value other than the output of the first stage; wherein during a first clock phase, the storage node is connected to the output of the first stage and during a second clock phase, the storage node is connected to the second different logic value; and wherein during both the first and the second clock phases, the reference node is coupled to the reference logic value to retain a logic state of the first clock phase of the multi-stage processor pipeline architecture;
    a storage capacitor being couple between the storage node and a ground; and
    a logic state storing and dividing device including a reference capacitor, the logic state storing and dividing device coupled between the reference node and the reference logic in a manner to generate a logic at the reference node that is a fraction of the reference logic.

2. The system of claim 1, wherein the multi-stage processor pipeline architecture is powered by an intermittent power supply.

3. The system of claim 1, further comprising a second comparing device including a first input node and a second input node, the first input node being coupled to the reference node, and the second input node being coupled to a second reference node representing a minimum voltage at the reference node to guarantee data validity on the reference capacitor.

4. The system of claim 1, further comprising a second comparing device including a first input node and a second input node, the first input node being coupled to the reference node, and the second input node being coupled to a second reference node representing a minimum voltage at the reference node to guarantee that the reference capacitor has been fully charged to store and retain data transmitted from the reference logic.

5. The system of claim 1, further comprising a feedback loop that transmits an output of the comparing device back to the storage node.

6. The system of claim 1, further comprising a bypass loop that connects directly the first stage and the second stage through a switch.

7. A method for retaining a logic state of a multi-stage processor pipeline architecture, the method comprising:
    coupling between a first stage and a second stage of the multi-stage processor pipeline architecture a storage cell, the storage cell including a comparing device that includes a storage node and a reference node;
    coupling the storage node to an output of the first stage;
    coupling the reference node to a reference logic that is the same as the output of the first stage;
    coupling a storage capacitor between the storage node and a ground to store the output of the first stage; and
    coupling a logic state storing and dividing device between the reference node and the reference logic in a manner to generate a logic at the reference node that is a fraction of the reference logic, the logic state and dividing device including a reference capacitor to retain a logic state of the multi-stage processor pipeline architecture;
    providing a second comparing device for comparing a logic at the reference node to a threshold value to determine validity of data stored on the reference capacitor.

8. The method of claim 7, wherein the multi-stage processor pipeline architecture is powered by an intermittent power supply.

9. The method of claim 7, further comprising coupling a second different logic other than the output of the first stage to the storage node, wherein during a first clock phase, the storage node is connected to the output of the first stage and during a second clock phase, the storage node is connected to the second different logic; and wherein during both the first and the second clock phases, the reference node is connected to the reference logic to retain a logic state of the first clock phase.

10. The method of claim 7, further providing a second comparing device for comparing a logic at the reference node to a threshold value to determine whether the reference capacitor has been fully charged to store and retain data transmitted from the reference logic.

11. The method of claim 7, further providing a feedback loop to transmit an output of the comparing device back to the storage node.

12. The method of claim 7, further providing a bypass loop to connect directly the first stage and the second stage through a switch.

13. The method of claim 7, further comprising monitoring a clock phase of the multi-stage processor pipeline architecture.

14. A program product stored on a computer-readable storage medium, which when executed, enables a computer infrastructure to retain a logic state of a multi-stage processor pipeline architecture, the program product comprising computer program code for enabling the computer infrastructure to:
   collect data regarding a state of a storage cell positioned between a first stage and a second stage of the multi-stage processor pipeline architecture, the storage cell including a comparing device which includes a storage node and a reference node, a storage capacitor being coupled between the storage node and a ground;
   control monitoring a power supply of the multi-stage processor pipeline architecture;
   control monitoring a clock phase of the multi-stage processor pipeline architecture;
   control connecting the storage node to an output of the first stage to store the output information in the storage capacitor; and
   control connecting the reference node to a reference logic that is the same as the output of the first stage;
   wherein a logic state storing and dividing device is coupled between the reference node and the reference logic in a manner to generate a logic at the reference node that is a fraction of the reference logic, the logic state and dividing device including a reference capacitor to retain a logic state of the multi-stage processor pipeline architecture;
   control comparing a logic at the reference node to a threshold value to determine whether the reference capacitor has been fully charged to store and retain data transmitted from the reference logic.

15. The program product of claim 14, wherein the computer program code is further configured to enable the computer infrastructure to control connecting the storage node to the output of the first stage during a first clock phase, and control connecting the storage node to a second different logic during a second clock phase, and control connecting the reference node to the reference logic during both the first and the second clock phases to retain a logic state of the first clock phase.

16. The program product of claim 14, wherein the computer program code is further configured to enable the computer infrastructure to control comparing a logic at the reference node to a threshold value to determine validity of data stored on the reference capacitor.

17. The program product of claim 14, wherein the multi-stage processor pipeline architecture is powered by an intermittent power supply.

* * * * *